United States Patent
Xie

(10) Patent No.: US 8,242,768 B2
(45) Date of Patent: Aug. 14, 2012

(54) SYSTEM FOR TESTING POWER SUPPLY PERFORMANCE

(75) Inventor: Ling-Yu Xie, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 362 days.

(21) Appl. No.: 12/558,599

(22) Filed: Sep. 14, 2009

(65) Prior Publication Data

US 2010/0320998 A1  Dec. 23, 2010

(30) Foreign Application Priority Data

Jun. 22, 2009 (CN) .......................... 2009 1 0303505

(51) Int. Cl.
*G01R 19/00* (2006.01)
(52) U.S. Cl. .................................... 324/76.11; 324/522
(58) Field of Classification Search ............... 324/76.11, 324/764.01, 306, 522, 771, 142; 345/60; 399/50; 327/108; 323/273
See application file for complete search history.

(56) References Cited

U.S. PATENT DOCUMENTS

| | | | | |
|---|---|---|---|---|
| 5,786,774 A | * | 7/1998 | Sabol | 340/984 |
| 5,994,892 A | * | 11/1999 | Turino et al. | 324/142 |
| 6,198,262 B1 | * | 3/2001 | Squibb et al. | 323/273 |
| 6,198,302 B1 | * | 3/2001 | Dougherty | 324/764.01 |
| 7,659,726 B2 | * | 2/2010 | Satoh et al. | 324/522 |
| 2001/0019669 A1 | * | 9/2001 | Watanabe et al. | 399/50 |
| 2002/0093470 A1 | * | 7/2002 | Kim et al. | 345/60 |
| 2010/0156496 A1 | * | 6/2010 | Rana et al. | 327/306 |

FOREIGN PATENT DOCUMENTS

JP  10068748 A  *  3/1998

* cited by examiner

*Primary Examiner* — Huy Q Phan
*Assistant Examiner* — Temilade S Rhodes-Vivour
(74) *Attorney, Agent, or Firm* — Altis Law Group, Inc.

(57) ABSTRACT

A system for testing power supply performance includes a DC power supply, a test apparatus for testing the DC power supply, and a control circuit electrically coupled to the DC power supply and the test apparatus. The control circuit includes an A/D conversion circuit, and a voltage level conversion circuit. The A/D conversion circuit receives DC voltage signals from the power supply, and converts the received DC voltage signals to digital signals. The voltage level conversion circuit receives the digital signals, and converts the received digital signals to voltage level signals which can be identified by the test apparatus. The test apparatus receives the voltage level signals, and generates signal waveforms of the voltage signals according to the received voltage level signals.

5 Claims, 5 Drawing Sheets

SYSTEM FOR TESTING POWER SUPPLY PERFORMANCE

BACKGROUND

1. Technical Field

The present disclosure relates to testing systems, and particularly to a system for testing power supply performance.

2. Description of Related Art

Most electronic apparatuses are not equipped with internal power supply devices in order to save space and costs. Therefore, these electronic apparatuses require external power supplies. Computers are powered by power supplies, which is capable of converting alternating current into direct current. The reliability of power supplies is measured by comparing the input and output voltages of the power supplies. Brownout/Recovery testing is an important test for determining the reliability of power supplies. By gradually decreasing or increasing the input voltages of the power supplies, and the output voltages of the power supply are measured and if they are within allowable limits a Power Good (PG) signal is outputted. However, the above testing method needs an operator to operate the test apparatus and record the main output voltage and PG output voltage.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
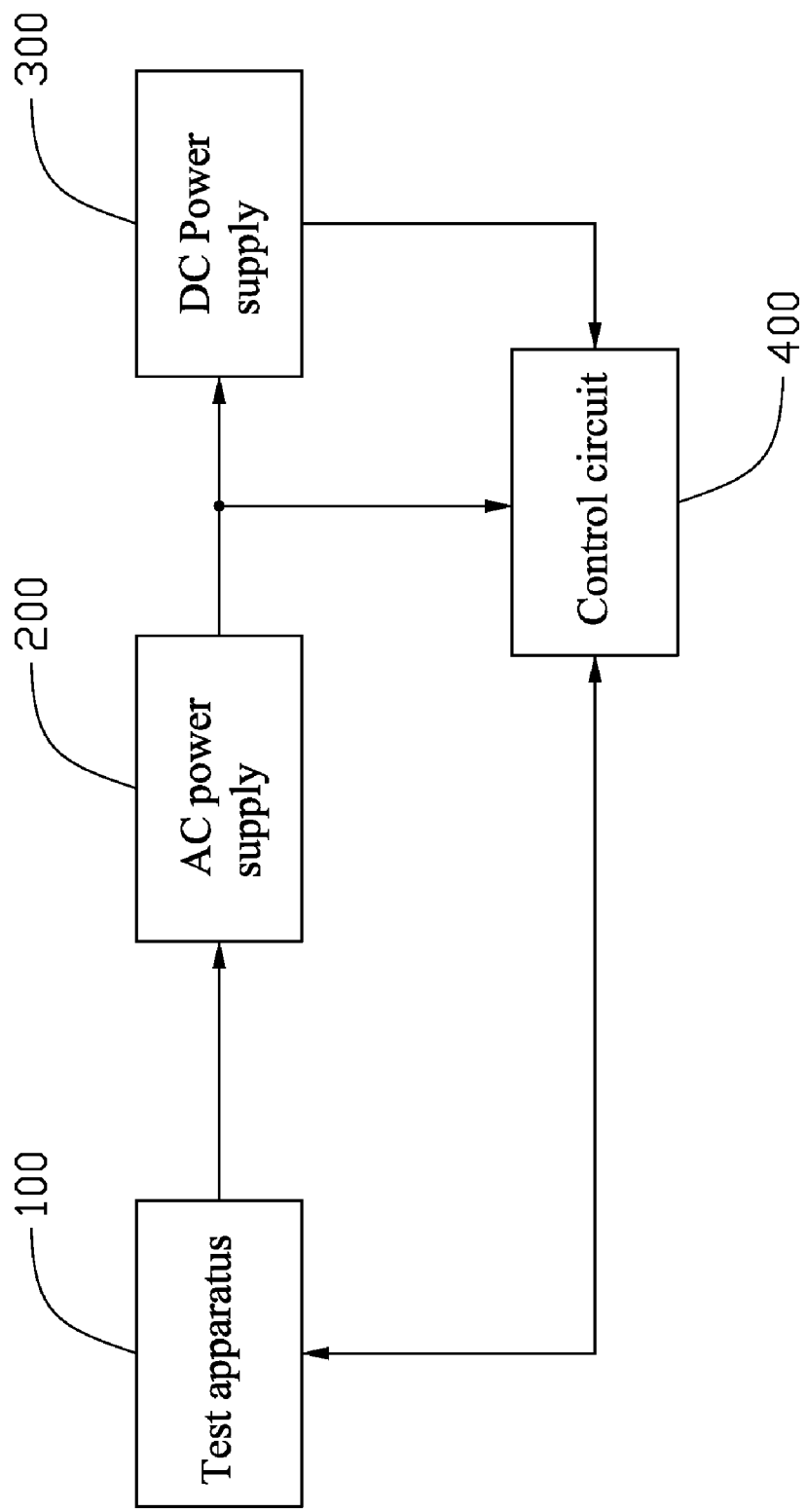
FIG. 1 is a block diagram of a system for testing power supply performance, in accordance with an embodiment.

Referring to FIG. 1, a system for testing power supply performance includes a test apparatus 100, an AC power supply 200, a DC power supply 300, and a control circuit 400. The test apparatus 100 controls the AC power supply 200 to provide a 100V AC voltage to the DC power supply 300. The AC power supply 200 outputs the 100V AC voltage to the control circuit 400. The DC power supply 300 converts the 100V AC voltage to a 12V DC voltage and a SB (Standby) DC voltage, and outputs the converted DC voltages to the control circuit 400. The control circuit 400 converts the AC voltage from the AC power supply 200 and the DC voltages from the DC power supply 300 to voltage level signals which can be identified by the test apparatus 100. The test apparatus 100 receives the voltage level signals from the control circuit 400, and generates signal waveforms of the DC voltages according to the received voltage level signals. The test apparatus 100 may be, for example, a personal computer, or other device capable of doing the functions of the test apparatus 100. The AC power supply 200 is electrically coupled to a 220V AC voltage, and converts the 220V AC voltage to the 100V AC voltage. The DC power supply 300 is electrically coupled to a load (not shown), such as a personal computer.

Figure 2:
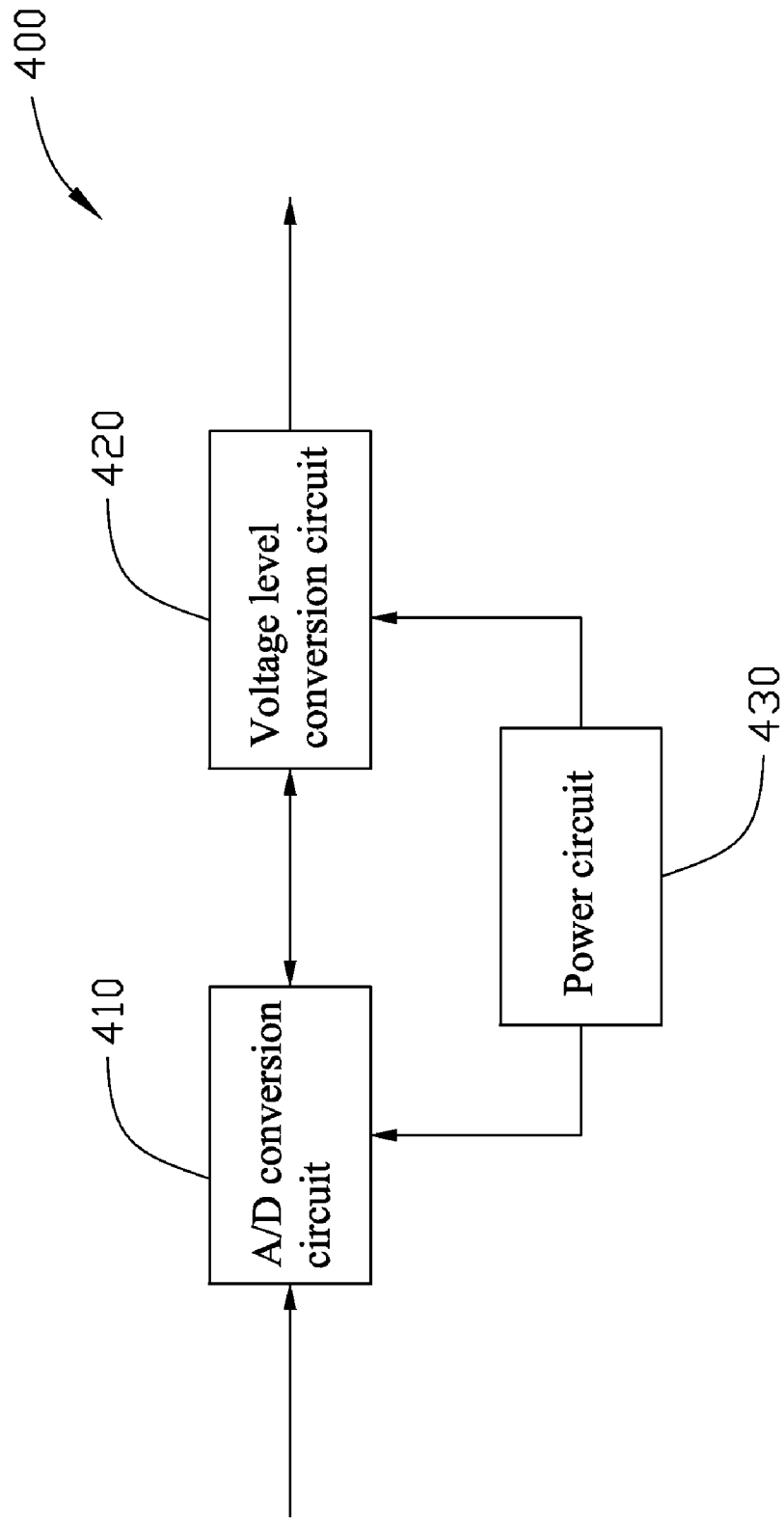
FIG. 2 is a block diagram of a control circuit of FIG. 1.

Referring to FIG. 2, the control circuit 400 includes an A/D conversion circuit 410, a voltage level conversion circuit 420, and a power circuit 430. The A/D conversion circuit 410 receives the AC voltage from the AC power supply 200 and the DC voltages from the DC power supply 300. The voltage level conversion circuit 420 outputs voltage level signals which can be identified by the test apparatus 100. The power circuit 430 provides working voltages to the A/D conversion circuit 410 and the voltage level conversion circuit 420.

Figure 3:
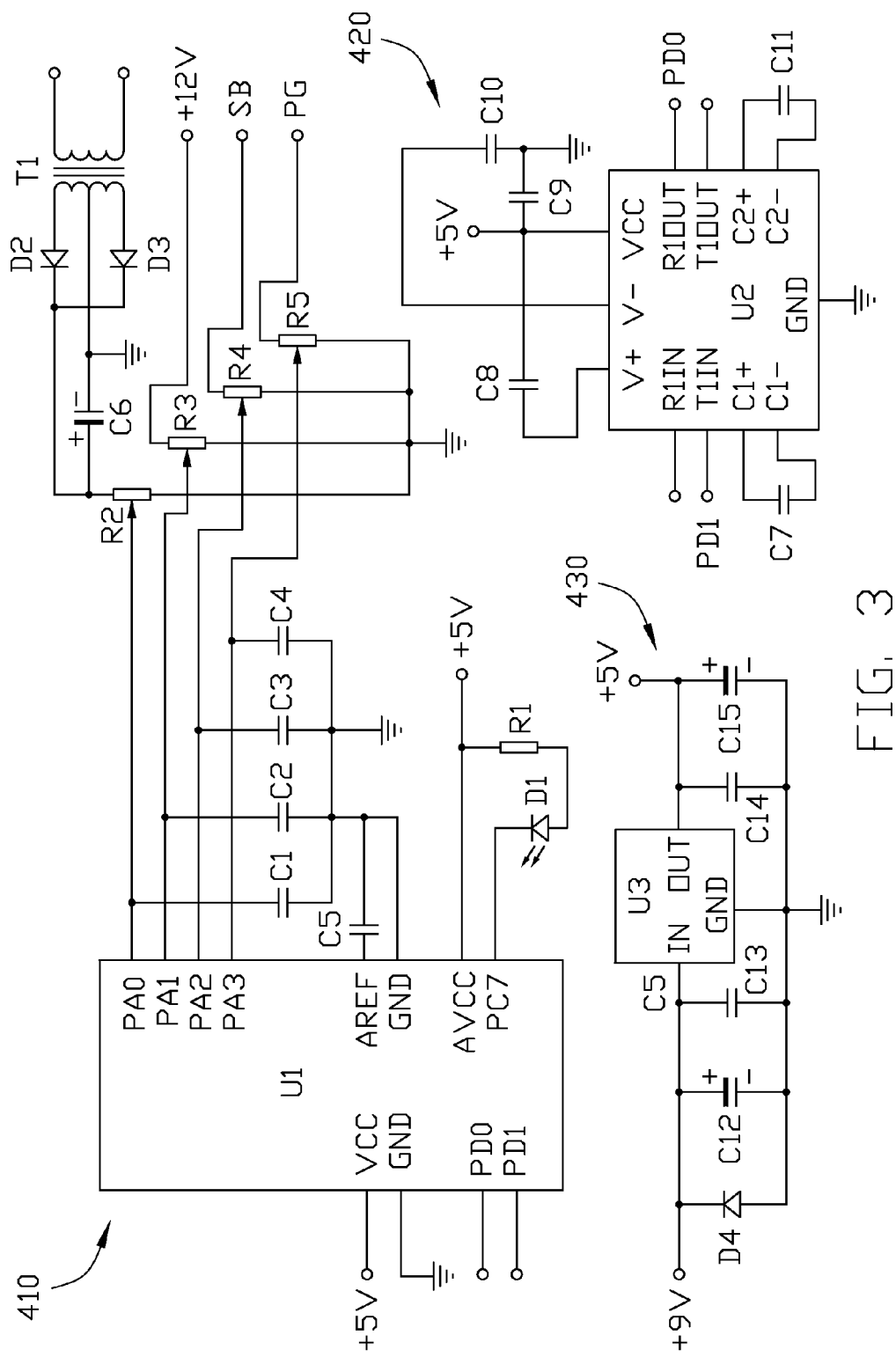
FIG. 3 is circuit diagrams of an A/D conversion circuit, a voltage level conversion circuit, and a power circuit of FIG. 2.

Referring to FIG. 3, the A/D conversion circuit 410 includes a microcontroller U1, a transformer T1, diodes D1~D3, capacitors C1~C6, and resistors R1~R5. The microcontroller U1 includes I/O ports PA0~PA3, PC7, PD0, PD1, an analog signal reference port AREF, a ground port GND, an analog signal power port AVCC, and a power port VCC. Turns ratio at the transformer T1 input terminal and output terminal may be, for example, 10:1. The diode D1 is an LED and emits light to indicate when the test is complete. The resistors R2~R5 are adjustable resistors. The transformer T1 input terminal is electrically coupled to the AC power supply 200 output terminal for receiving the 100V AC voltage. The transformer T1 output terminal is electrically coupled to the resistor R2 first terminal via the diodes D2, D3 and capacitor C6. The resistor R2 second terminal is grounded. The resistor R2 adjusting terminal is electrically coupled to the I/O port PA0. The resistors R3~R5 first terminals are electrically coupled to receive the 12V DC voltage, SB DC voltage, and PG DC voltage from the DC power supply 300 respectively. The resistors R3~R5 second terminals are grounded. The resistors R3~R5 adjusting terminals are electrically coupled to the I/O ports PA1~PA3 respectively. The resistors R3~R5 adjusting terminals are electrically coupled to the capacitor C5 first terminal and the microcontroller U1 ground port GND via the capacitors C1~C4 respectively. The capacitor C5 second terminal is electrically coupled to the analog signal reference port AREF. The microcontroller U1 analog signal power port AVCC and power port VCC receive a 5V DC voltage from the power circuit 430 respectively. The analog signal power port AVCC is electrically coupled to the I/O port PC7 via the resistor R1 and diode D1. The I/O ports PA0~PA3 act as analog signals input terminals respectively. The I/O ports PD0, PD1 act as digital signals receiving and transmitting terminals respectively.

The voltage level conversion circuit 420 includes a voltage level conversion chip U2, and capacitors C7~C11. In this embodiment, the voltage level conversion chip U2 is a MAX232 type chip for RS-232 standard interface circuit of computer. The voltage level conversion chip U2 includes charge ports C1+, C1−, V+, V−, C2+, C2−, data transforming ports T1 IN, T1 OUT, R1 IN, R1 OUT, a power port VCC, and a ground port GND. The charge ports C1+, C2+ are electrically coupled to the charge ports C1−, C2 via the capacitors C7, C11 respectively. The charge ports V+, V− are electrically coupled to the 5V DC voltage and ground via the capacitors C8, C10 respectively. The charge ports C1+, C1−, V+, V−, C2+, C2− and capacitors C7, C8, C10, C11 forms a charge pump circuit for generating a +12V voltage and a −12V voltage which are provided to the RS-232 standard interface circuit. The voltage level conversion chip U2 power port VCC is electrically coupled to the 5V DC voltage, and is grounded via the capacitor C9. The data transforming port T1 IN acts as a voltage level signal receiving terminal for receiving the digital signals from the I/O port PD1. The data transforming port T1 OUT acts as a voltage level signal transmitting terminal for transmitting the converted voltage level signals to the test apparatus 100. The data transforming port R1 IN acts as a voltage level signal receiving terminal for receiving feedback signals from the test apparatus 100. The voltage level conversion chip U2 converts the feedback signals to digital signals which can be identified by the microcontroller U1. The data transforming port R1 OUT acts as a voltage level signal transmitting terminal for transmitting the converted feedback signals to the I/O port PD0.

The power circuit 430 includes a voltage regulator U3, a diode D4, and capacitors C12~C15. The voltage regulator U3 includes an input terminal IN, a ground terminal GND, and an output terminal OUT. The voltage regulator U3 input terminal IN is electrically coupled to the capacitor C12 first terminal and the capacitor C13 first terminal, and is electrically coupled to the cathode of the diode D4. The capacitor C12 second terminal and the capacitor C13 second terminal are electrically coupled to the voltage regulator U3 ground terminal GND. The anode of the diode D4 is electrically coupled to the voltage regulator U3 ground terminal GND. The voltage regulator U3 output terminal OUT is electrically coupled to the capacitor C14 first terminal and the capacitor C15 first terminal The capacitor C14 second terminal and the capacitor C15 second terminal are electrically coupled to the voltage regulator U3 ground terminal GND. The voltage regulator U3 input terminal IN acts as the power circuit 430 input terminal electrically coupled to a voltage adapter (not shown). The voltage regulator U3 output terminal OUT acts as the power circuit 430 output terminal provides the 5V DC voltage to the microcontroller U1 and voltage level conversion chip U2. In this embodiment, the voltage adapter (not shown) converts the 220V AC voltage to a 9V DC voltage.

Figure 4:
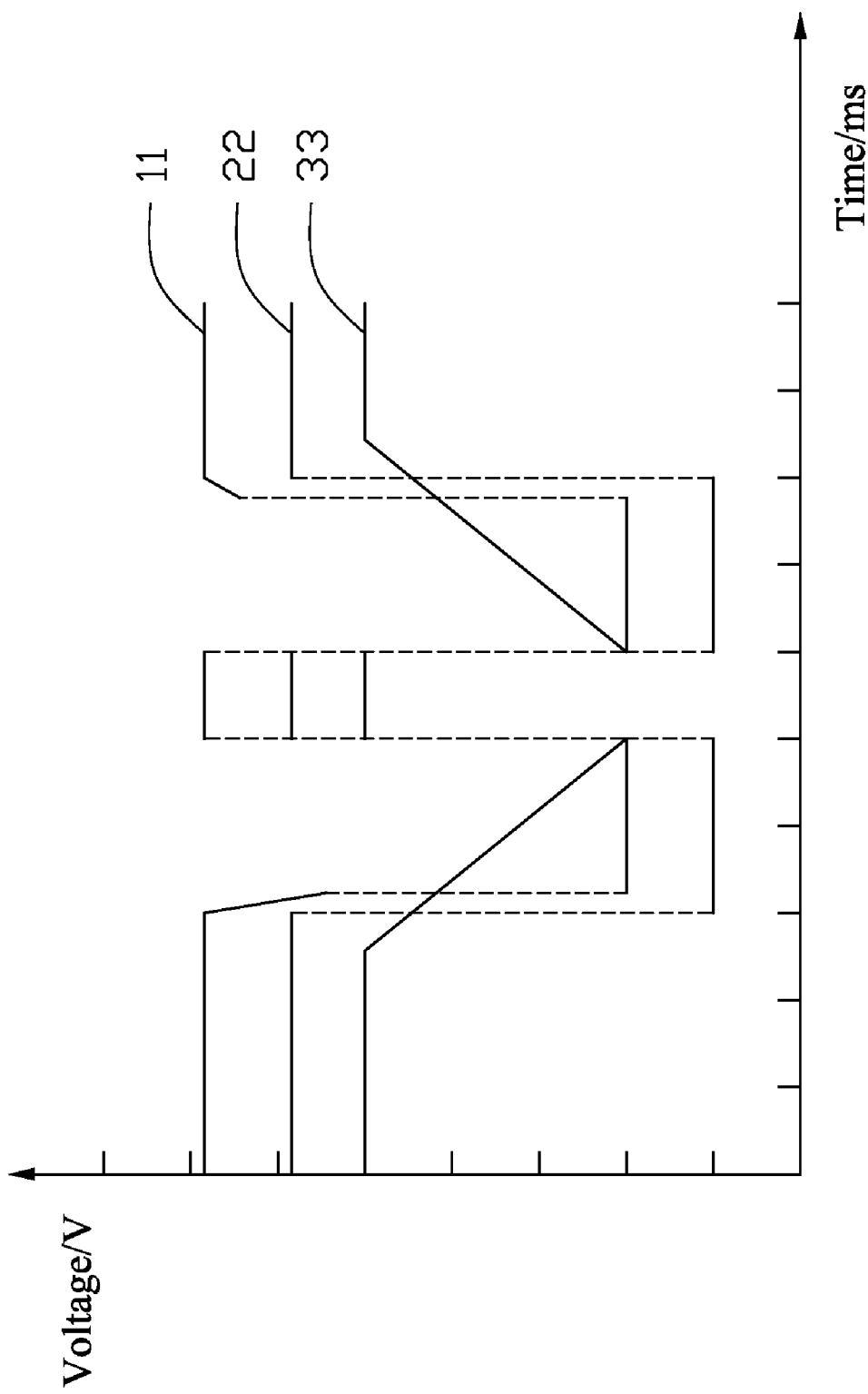
FIG. 4 is a comparative graph showing signal waveforms obtained at output terminals of a power supply.
Figure 5:
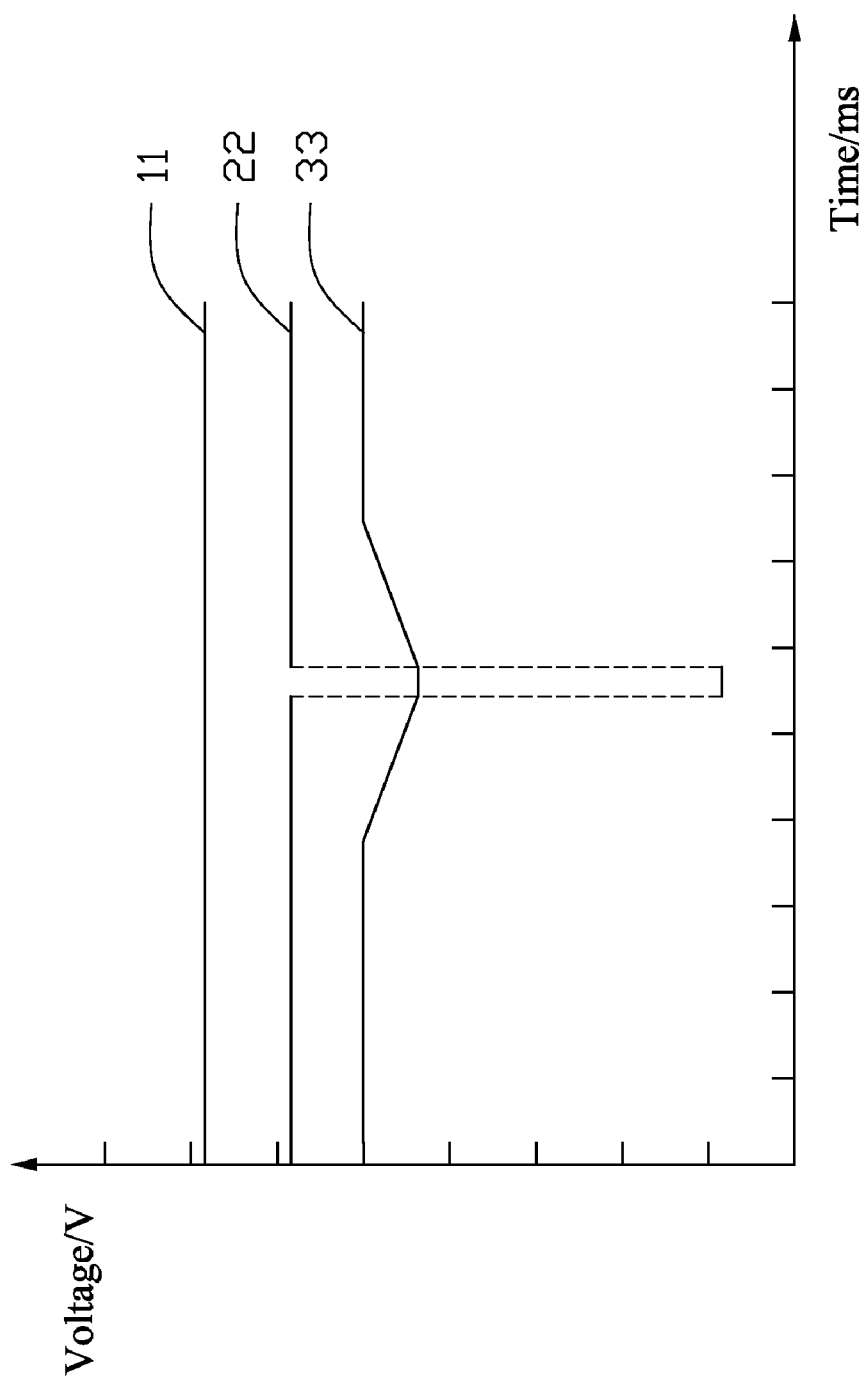
FIG. 5 is a comparative graph showing signal waveforms obtained at output terminals of the power supply of FIG. 4.

In test, the DC power supply 300 is electrically coupled to the test system as shown in FIG. 1. The test apparatus 100 generates signal waveforms of the DC voltages according to the received voltage level signals as shown in FIGS. 4 and 5, signal waveforms 11, 22, 33 are corresponding to the 12V DC voltage, the PG DC voltage, and the 100V DC voltage respectively. In FIG. 4, when the 100V DC voltage of the AC power supply 200 gradually decreased to 80V, the 12V DC voltage also gradually decreased, and the DC power supply 300 does not output the PG DC voltage. When the AC power supply 200 output decreased to 70V, the DC power supply 300 does not output the 12V DC voltage, and then the AC power supply 200 output gradually decreased to 0V. In a period of time afterward, the AC power supply 200 output jump from 0V to 100V, and then drop from 100V to 0V, the 12V DC voltage and PG DC voltage also jump and drop as the AC power supply 200 output changes. At last, the AC power supply 200 output gradually increased from 0V. When the AC power supply 200 output increased to 70V, the 12V DC voltage gradually increased. When the AC power supply 200 output increased to 80V, the 12V DC voltage and the PG DC voltage all resumed.

In FIG. 5, the 100V DC voltage of the AC power supply 200 gradually decreased to 80V, and then the AC power supply 200 output gradually increased from 80V to 100V. In this process, the 12V DC voltage normally output and the PG DC voltage only jump once when the AC power supply 200 output is 80V. It can be seen that when the AC power supply 200 output decreased or increased to corresponding threshold values, the 12V DC voltage and PG DC voltage drop or jump directly without delay. Therefore, Brownout/Recovery testing of the DC power supply 300 is normal.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A system for testing power supply performance, comprising:
    a DC power supply;
    a test apparatus for testing the DC power supply; and
    a control circuit electrically coupled to the DC power supply and test apparatus, the control circuit comprising:
    an A/D conversion circuit configured for receiving DC voltage signals from the DC power supply and converting the received DC voltage signals to digital signals, the A/D conversion circuit comprising a microcontroller; and
    a voltage level conversion circuit configured for receiving the digital signals, and converting the received digital signals to voltage level signals which can be identified by the test apparatus, the test apparatus receives the voltage level signals, and generates signal waveforms of the voltage signals according to the received voltage level signals; wherein the A/D conversion circuit comprises a microcontroller, and a transformer, the transformer receives the AC voltage from the AC power supply, and converts the AC voltage to a smaller DC voltage signal, the microcontroller comprises a plurality of signal input terminals and a digital signal transmitting terminal, each signal input terminal receives DC voltage signals from the transformer and the DC power supply via a plurality of adjustable resistors respectively, a plurality of adjusting terminals of the plurality of adjustable resistors are electrically connected to the plurality of signal input terminals, and the digital signal transmitting terminal outputs the digital signals;
    wherein the microcontroller further comprises a digital signal receiving terminal, the voltage level conversion circuit further comprises a second voltage level signal receiving terminal, and a second voltage level signal transmitting terminal, the second voltage level signal receiving terminal receives feedback signals from the test apparatus, the voltage level conversion circuit converts the feedback signals to digital signals which can be identified by the microcontroller, the second voltage level signal transmitting terminal transmits the converted feedback signals to the digital signal receiving terminal; wherein the voltage level conversion circuit comprises a voltage level conversion circuit, the voltage level conversion circuit comprises a first voltage level signal receiving terminal, and a first voltage level signal transmitting terminal, the first voltage level signal receiving terminal receives the digital signals, the first voltage level signal transmitting terminal transmits the voltage level signals to the test apparatus.

2. The system of claim 1, further comprising an AC power supply electrically coupled to the test apparatus and the DC power supply, the test apparatus controlling the AC power supply to provide an AC voltage to the DC power supply, the AC power supply transmitting the AC voltage to the control circuit, the control circuit converting the DC power supply output voltage signals to voltage level signals which can be identified by the test apparatus according to the change of the AC voltage.

3. The system of claim 1, wherein the control circuit further comprises a power circuit for providing the working voltages to the A/D conversion circuit and voltage level conversion circuit.

4. The system of claim 3, wherein the power circuit comprises a voltage regulator, and a diode, the voltage regulator includes an input terminal, a ground terminal, and an output terminal, the voltage regulator input and output terminals are electrically coupled to a plurality of capacitors first terminals respectively, the plurality of capacitors second terminals are electrically coupled to the ground terminal, the voltage regulator input terminal is electrically coupled to the diode cathode, the diode anode is electrically coupled to the voltage regulator ground terminal, the voltage regulator input terminal acts as the power circuit input terminal and is electrically coupled to a voltage adapter, the voltage regulator output terminal acts as the power circuit output terminal and provides the working voltages to the microcontroller and voltage level conversion circuit.

5. The system of claim 1, wherein the A/D conversion circuit comprises a transformer, the transformer receives the AC voltage from the AC power supply, and converts the AC voltage to a smaller DC voltage signal, the microcontroller comprises a plurality of signal input terminals and a digital signal transmitting terminal, each signal input terminal receives DC voltage signals from the transformer and the DC power supply via a plurality of adjustable resistors respectively, a plurality of adjusting terminals of the plurality of adjustable resistors are electrically connected to the plurality of signal input terminals, and the digital signal transmitting terminal outputs the digital signals.

* * * * *